United States Patent
Paul et al.

(10) Patent No.: US 9,921,006 B2
(45) Date of Patent: Mar. 20, 2018

(54) SYSTEMS AND METHODS OF MANUFACTURING MICROCHANNEL ARRAYS

(71) Applicant: Oregon State University, Corvallis, OR (US)

(72) Inventors: Brian K. Paul, Corvallis, OR (US); Samuel T. Brannon, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 254 days.

(21) Appl. No.: 14/774,093

(22) PCT Filed: Mar. 12, 2014

(86) PCT No.: PCT/US2014/024341
§ 371 (c)(1),
(2) Date: Sep. 9, 2015

(87) PCT Pub. No.: WO2014/165088
PCT Pub. Date: Oct. 9, 2014

(65) Prior Publication Data
US 2016/0025427 A1    Jan. 28, 2016

Related U.S. Application Data

(60) Provisional application No. 61/778,053, filed on Mar. 12, 2013.

(51) Int. Cl.
*F28F 3/08*    (2006.01)
*F28F 3/02*    (2006.01)
(Continued)

(52) U.S. Cl.
CPC .............. *F28F 3/025* (2013.01); *B23P 15/26* (2013.01); *B32B 37/12* (2013.01); *B32B 37/18* (2013.01);
(Continued)

(58) Field of Classification Search
CPC .... F28F 3/025; F28F 3/046; F28F 9/02; F28F 2260/02; B23P 15/26; B23B 15/26;
(Continued)

(56) References Cited

U.S. PATENT DOCUMENTS 4,124,478 A * 11/1978 Tsien .................. B01D 63/082
165/166
4,516,632 A * 5/1985 Swift .................... F28D 9/0075
165/166
(Continued)

OTHER PUBLICATIONS

International Search Report and Written Opinion issued May 28, 2014, by the ISA/US for corresponding PCT Patent Application No. PCT/US2014/024341, filed Mar. 12, 2014.
(Continued)

*Primary Examiner* — Justin Jonaitis
(74) *Attorney, Agent, or Firm* — Klarquist Sparkman, LLP

(57) ABSTRACT

The present application relates to apparatus and methods of reducing the cost of microchannel array production and operation. In a representative embodiment, a microchannel array can comprise a first lamina having one or more flanges and a plurality of elongated bosses. The one or more flanges can extend along a perimeter of the first lamina, the plurality of elongated bosses can at least partially define a plurality of first flow paths, and the first lamina can define at least one opening. The microchannel array can also comprise a second lamina having a plurality of second flow paths, and can define at least one opening. The second lamina can be disposed above the first lamina such that the second lamina
(Continued)

encloses the first flow paths of the first lamina and the at least one opening of the first lamina is coaxial with the at least one opening of the second lamina.

24 Claims, 8 Drawing Sheets

(51) Int. Cl.

| | |
|---|---|
| *F28D 9/00* | (2006.01) |
| *B81C 99/00* | (2010.01) |
| *B23P 15/26* | (2006.01) |
| *B32B 37/12* | (2006.01) |
| *B32B 37/18* | (2006.01) |
| *F28F 3/04* | (2006.01) |
| *F28F 9/02* | (2006.01) |

(52) U.S. Cl.
CPC ........ *B81C 99/0095* (2013.01); *F28D 9/0043* (2013.01); *F28F 3/046* (2013.01); *F28F 9/02* (2013.01); *B32B 2311/00* (2013.01); *B32B 2457/00* (2013.01); *B81B 2201/058* (2013.01); *B81C 2201/019* (2013.01); *F28F 2260/02* (2013.01)

(58) Field of Classification Search
CPC ..... B23B 37/12; B23B 37/18; B23B 2457/00; B81C 99/0095; B81C 2201/019; B81B 2201/058; F28D 9/0043
USPC .................................. 165/167, 166, 80.4, 168
See application file for complete search history.

(56) References Cited

U.S. PATENT DOCUMENTS

| | | | |
|---|---|---|---|
| 5,544,703 A * | 8/1996 | Joel .................... | F28F 3/048 165/166 |
| 6,260,612 B1 | 7/2001 | Nakamura et al. | |
| 6,745,832 B2 * | 6/2004 | Wellington ............ | C09K 8/592 166/245 |
| 6,946,113 B2 | 9/2005 | Seaba et al. | |
| 6,991,026 B2 | 1/2006 | Costen et al. | |
| 7,272,005 B2 * | 9/2007 | Campbell ............... | F28D 15/00 165/165 |
| 7,334,631 B2 * | 2/2008 | Kato ...................... | F28D 9/005 165/166 |
| 7,687,132 B1 | 3/2010 | Gross et al. | |
| 7,871,578 B2 | 1/2011 | Schmidt | |
| 9,452,462 B2 * | 9/2016 | Elgimiabi | |
| 2004/0011515 A1 * | 1/2004 | Matsushima ........... | F28D 9/005 165/166 |
| 2005/0202206 A1 | 9/2005 | Wadley et al. | |
| 2006/0102332 A1 | 5/2006 | Taras et al. | |
| 2009/0211740 A1 * | 8/2009 | Kesseli ................. | F28D 9/0043 165/166 |
| 2010/0326914 A1 | 12/2010 | Drost et al. | |

OTHER PUBLICATIONS

Kim et al., "Fluid-flow and endwall heat-transfer characteristics of an ultralight lattice-frame material," *International Journal of Heat and Mass Transfer*, 47, pp. 1129-1140, 2004.

Queheillalt et al., "Pyramidal lattice truss structures with hollow trusses," *Materials Science and Engineering*, A 397, pp. 132-137, 2005.

* cited by examiner

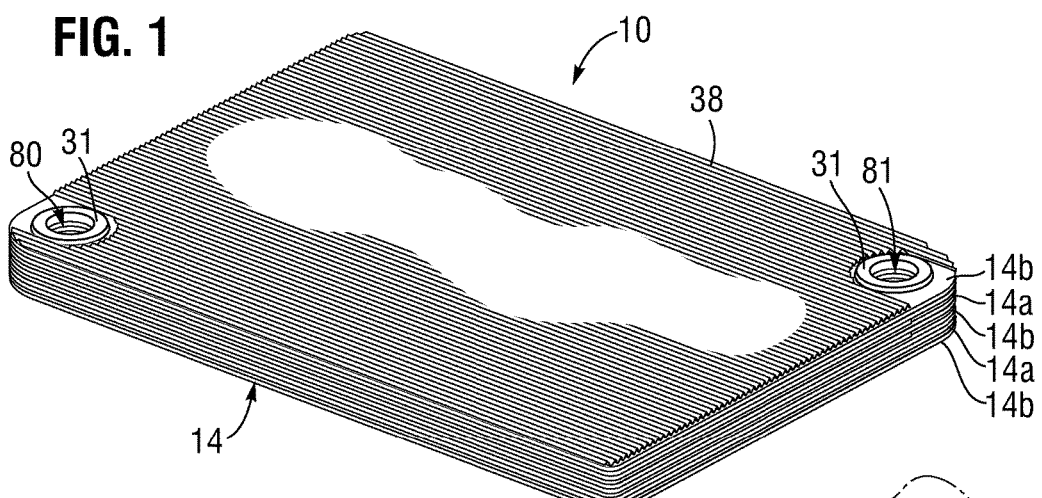
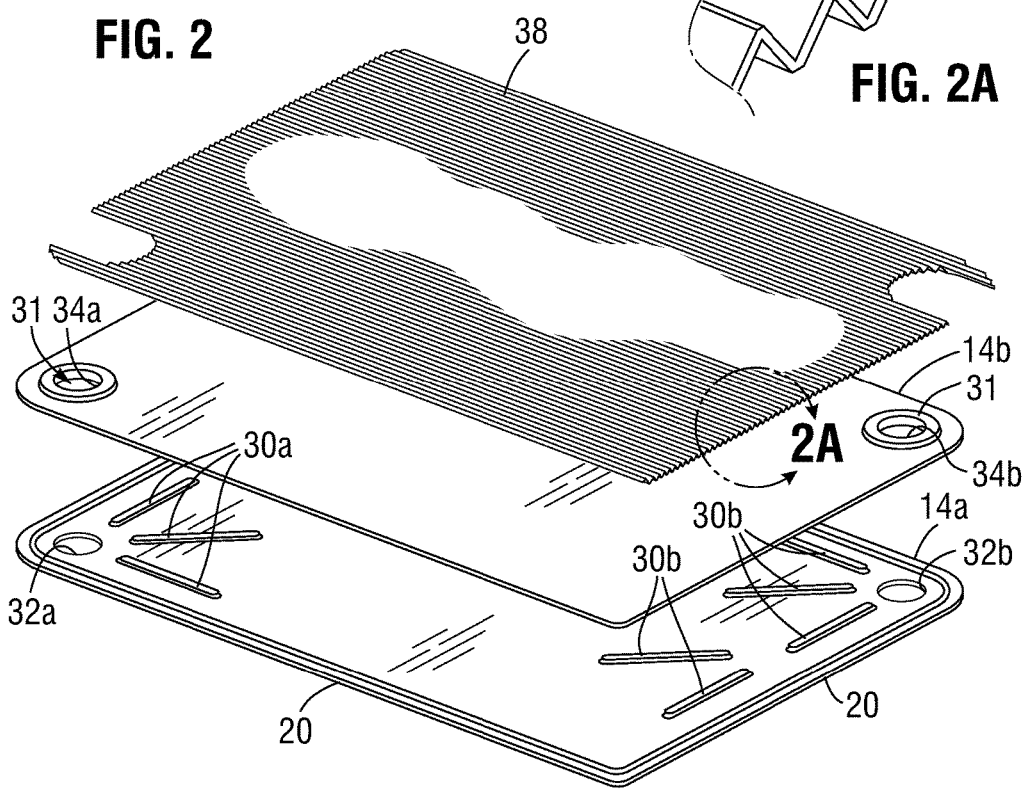

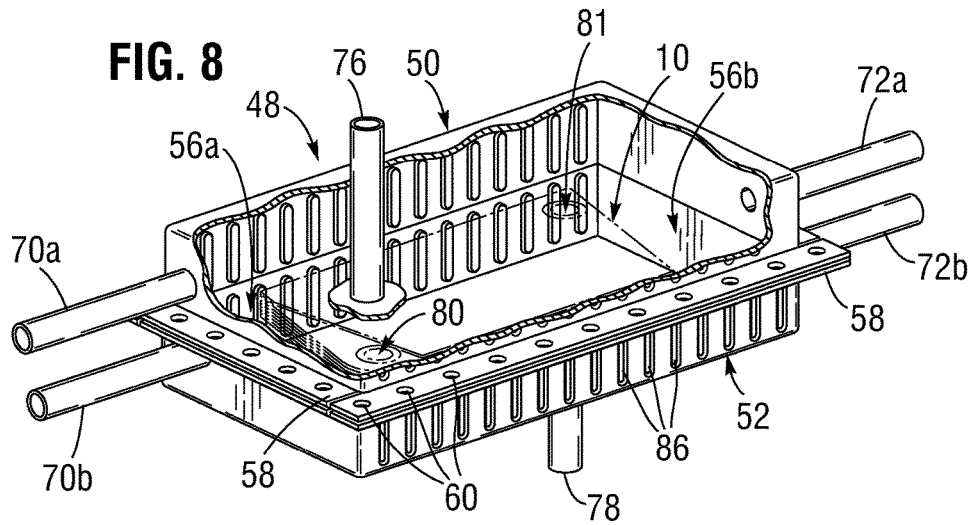
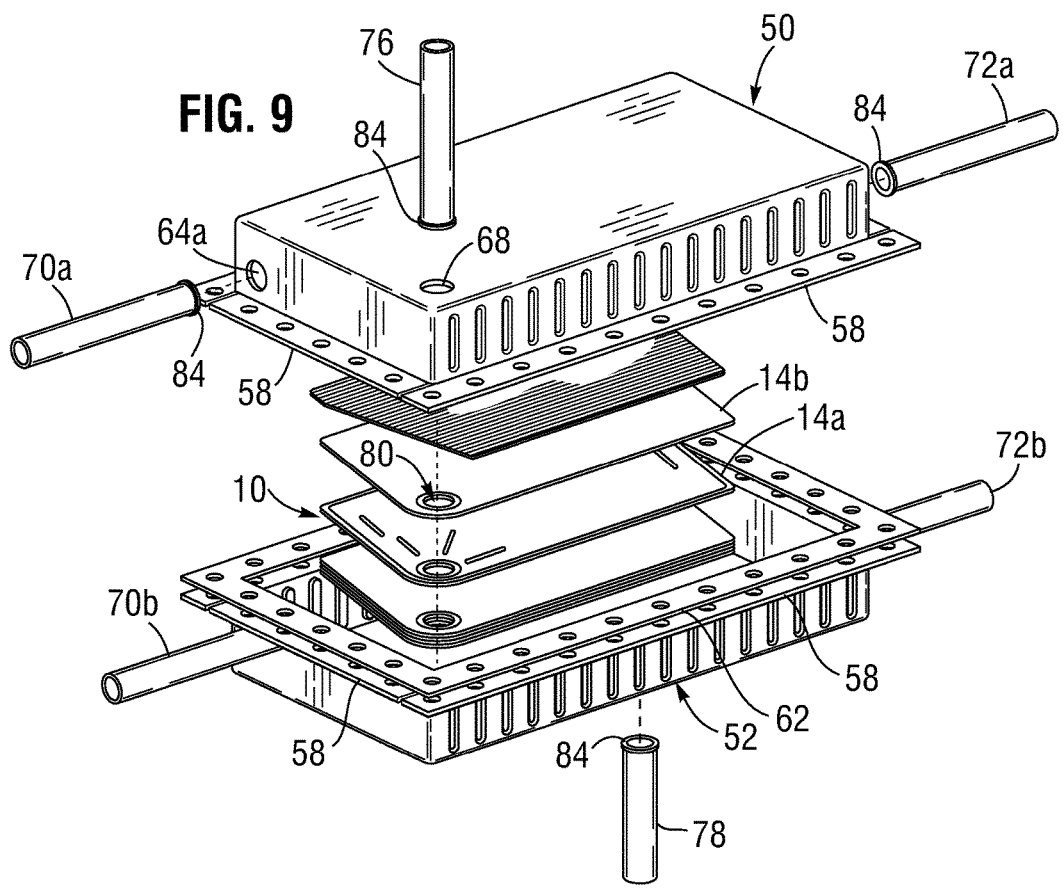

SYSTEMS AND METHODS OF MANUFACTURING MICROCHANNEL ARRAYS

CROSS REFERENCE TO RELATED APPLICATIONS

This is the U.S. National Stage of International Application No. PCT/US2014/024341, filed Mar. 12, 2014, which was published in English under PCT Article 21(2), which in turn claims the benefit of U.S. Provisional Application No. 61/778,053, filed Mar. 12, 2013, which is incorporated herein by reference.

ACKNOWLEDGEMENT OF GOVERNMENT SUPPORT

This invention was made with government support under contract number DE-AC06-76RL01830 awarded by the Department of Energy. The government has certain rights in the invention.

FIELD

The present application relates to microchannel process technology, and more particularly to apparatus and methods of reducing the cost of microchannel array production and operation.

BACKGROUND

Microchannel process technology (MPT) can be useful in a variety of applications including, for example, as recuperative heat exchangers in solid oxide fuel cells, as chemical reactors for fuel reforming, or for nanomaterial synthesis. The relatively large surface-area-to-volume ratios of microchannels can help to promote, for example, fast and efficient heat transfer between fluids in adjacent microchannels, or mass transfer for chemical reactions inside of microchannels. However, the cost of producing and maintaining microchannel arrays has limited the adoption of MPT in industry. Accordingly, improvements to microchannel array design are desirable.

SUMMARY

Several embodiments of devices and methods are shown and described herein directed to low-cost, high-performance microchannel array technology. In one representative embodiment, a microchannel array can comprise a first lamina having one or more flanges and a plurality of elongated bosses. The one or more flanges can extend along a perimeter of the first lamina, the plurality of elongated bosses can at least partially define a plurality of first flow paths, and the first lamina can define at least one opening. The microchannel array can also comprise a second lamina having a plurality of second flow paths, and can define at least one opening. The second lamina can be disposed above the first lamina such that the second lamina encloses the first flow paths of the first lamina and the at least one opening of the first lamina is coaxial with the at least one opening of the second lamina.

In another representative embodiment, a microchannel array comprises a first lamina having a side portion. The side portion can define a perimeter and can comprise one or more flanges extending along the perimeter of the first lamina. The first lamina can also include a plurality of first flow paths and at least one opening. The microchannel array can further comprise a second lamina having a plurality of second flow paths and a header portion. The header portion can comprise an annular boss, which can define an opening. The second lamina can be disposed above the first lamina such that the opening of the first lamina is coaxial with the opening of the second lamina.

In another representative embodiment, a method of making a microchannel array comprises providing a first lamina having one or more flanges and a plurality of elongated bosses. The one or more flanges can extend along a perimeter of the first lamina, and the plurality of elongated bosses can at least partially define a plurality of first flow paths. The first lamina can also define at least one opening. The method can further comprise providing a second lamina comprising a plurality of second flow paths and a header portion. The header portion can comprise an annular boss, which can define an opening. The method can further comprise bonding the second lamina to the one or more flanges of the first lamina such that the first flow paths of the first lamina are enclosed by the second lamina.

In another representative embodiment, a microchannel array can include a flow insert comprising a corrugated metal sheet configured as expanded metal foil.

In another representative embodiment, a microchannel array can include a flow insert comprising a corrugated metal sheet having a thickness of from about 0.001 inch to about 0.1 inch.

In another representative embodiment, a microchannel array can include a flow insert comprising a corrugated metal sheet having a thickness of from about 0.001 inch to about 0.015 inch.

In another representative embodiment, a microchannel array can include a flow insert comprising a corrugated metal sheet having a thickness of from about 0.002 inch to about 0.010 inch.

The foregoing and other objects, features, and advantages of the invention will become more apparent from the following detailed description, which proceeds with reference to the accompanying figures.

BRIEF DESCRIPTION OF THE DRAWINGS

FIG. 1 is a perspective view of a microchannel array.
FIG. 2 is an exploded view of a microchannel array.
FIG. 2A is a detail view of the flow insert shown in FIG. 2.
FIG. 8 is a perspective view of a microchannel array contained in a housing, with the housing shown partially cut away.
FIG. 9 is an exploded view of the microchannel array and housing of FIG. 8.

DETAILED DESCRIPTION

Figure 3:
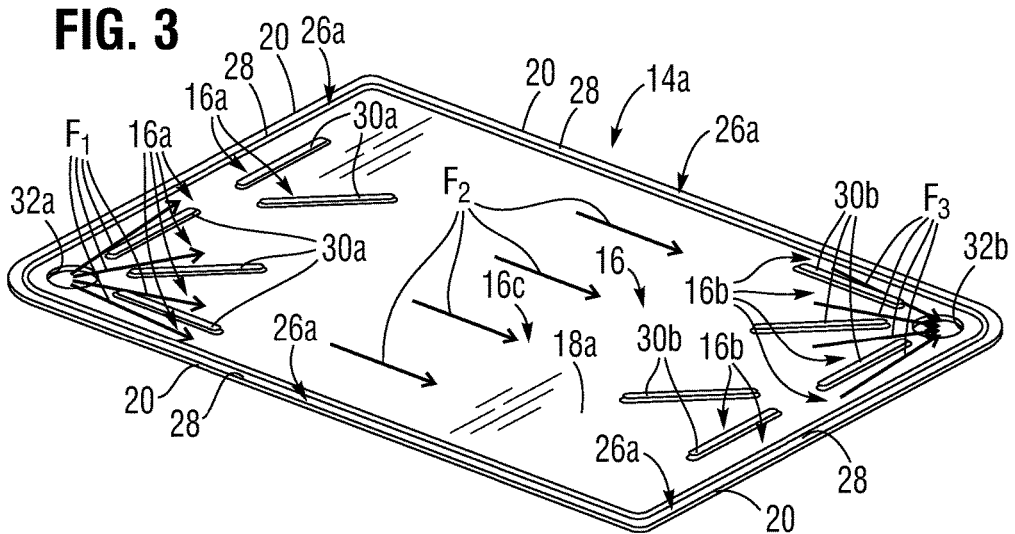
FIG. 3 is a perspective view of a first lamina.

For purposes of this description, certain aspects, advantages, and novel features of the embodiments of this disclosure are described herein. The disclosed methods, apparatuses, and systems should not be construed as limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

Referring to FIGS. 1-2, there is shown a first embodiment of a microchannel array 10 comprising a plurality of layers, or laminae 14, arranged in a stacked arrangement. The laminae 14 are configured as first and second laminae 14a, 14b. The first and second laminae 14a, 14b can have a plurality of first and second flow paths 16, 17, respectively, defined thereon (see, e.g., FIGS. 3 and 4). The first and second flow paths 16, 17 can be configured to direct a fluid flow generally along a length of the first and second laminae 14a, 14b, respectively. When the first and second laminae 14a, 14b are interleaved in a stacked arrangement (i.e., a first lamina 14a, then a second lamina 14b, then a first lamina 14a, etc.), the enclosed first and second flow paths 16, 17 of the respective first and second laminae 14a, 14b can define a plurality of first and second microchannels 12a, 12b (see, e.g., FIGS. 5, 7A and 7B). In the embodiment shown, the first and second flow paths 16, 17 can be configured as high-pressure and low pressure flow paths, respectively. Similarly, the first and second microchannels 12a, 12b can be configured as high-pressure and low-pressure microchannels, respectively.

The high-pressure microchannels 12a can be configured to operate at a first pressure $P_1$ and the low-pressure microchannels 12b are configured to operate at a second pressure $P_2$. The first pressure $P_1$ can be greater than the second pressure $P_2$. The first and second microchannels 12a, 12b can also be configured in a counterflow arrangement whereby a working fluid flows through the high-pressure microchannels 12a in a direction opposite that of a working fluid flowing through the low-pressure microchannels 12b. In some embodiments, the high-pressure and low-pressure flow paths 16, 17 can number generally from about one to about one hundred, depending upon the size and application of the microchannel array. The microchannel array 10 can also comprise one or more flow inserts 38, shown schematically in FIGS. 1, 2, and 2A, and further discussed below.

Although the following description proceeds with respect to a representative first lamina 14a and a representative second lamina 14b, it should be understood that the features described with respect to the representative first and second laminae 14a, 14b are applicable to a plurality of first and second laminae 14a, 14b in an assembled microchannel array 10. Referring to FIG. 3, there is shown a representative embodiment of a first lamina 14a. The first lamina 14a can include a plurality of inlet bosses 30a and a plurality of outlet bosses 30b, shown in an exemplary layout. The first lamina 14 can also comprise a plurality of high-pressure flow paths 16, which can include one or more high-pressure inlet flow paths 16a, one or more high-pressure outlet flow paths 16b, and one or more intermediate high-pressure flow paths 16c. In some embodiments, the high-pressure inlet and outlet flow paths 16a, 16b can be at least partially defined by the inlet and outlet bosses 30a, 30b, respectively. For example, the inlet bosses 30a can be elongated, and can extend radially from an inlet opening 32a, thereby defining the high-pressure inlet flow paths 16a. Similarly, the outlet bosses 30b can be elongated, and can extend radially from an outlet opening 32b, thereby defining the high-pressure outlet flow paths 16b.

The high-pressure inlet flow paths 16a can be configured to distribute a working fluid introduced through the inlet opening 32a evenly across a surface 18a of the first lamina 14a in the manner indicated by flow lines $F_1$. The working fluid can then travel along the one or more intermediate high-pressure flow paths 16c in the direction indicated by flow lines $F_2$. In some embodiments, the one or more intermediate high-pressure flow paths 16c can be configured as a substantially unrestricted flow region, and can comprise a single intermediate high-pressure flow path 16c extending across substantially the entire width of the first lamina 14a. The working fluid can then flow through the high-pressure outlet flow paths 16b generally in the direction of the outlet opening 32b, as indicated by flow lines $F_3$. Although the inlet and outlet bosses 30a, 30b are shown elongated, they may comprise any suitable shape. When a second lamina 14b is overlaid on top of the first lamina 14a, the high-pressure flow paths 16 can be enclosed to form high-pressure microchannels 12a.

Figure 5:
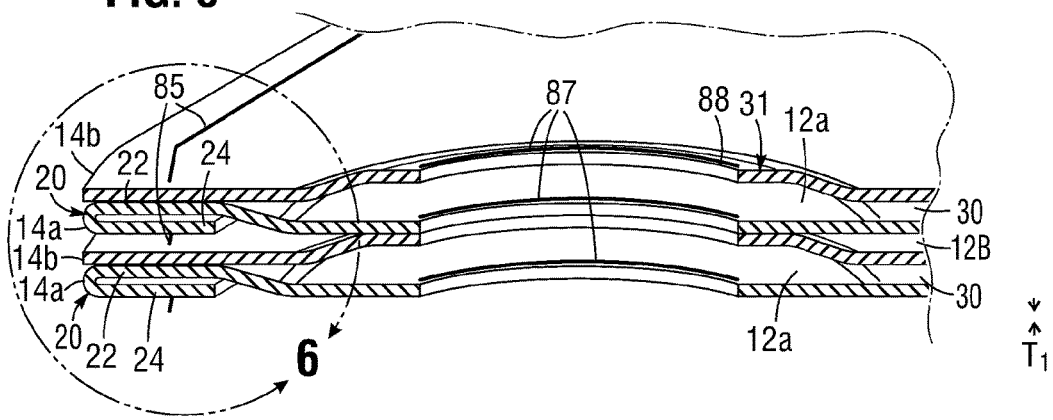
FIG. 5 is a partial cross-sectional view of a microchannel array.
Figure 6:
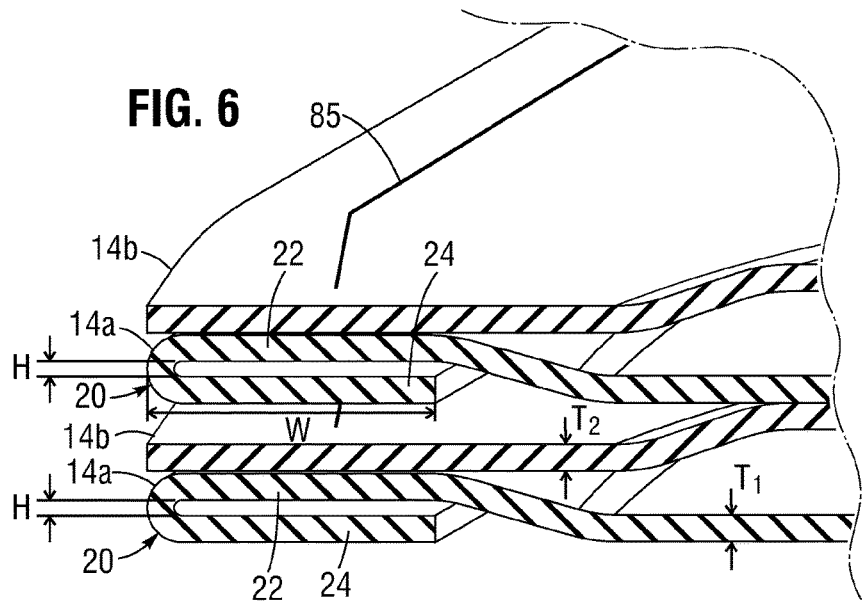
FIG. 6 is a magnified cross-sectional view of the microchannel array of FIG. 5.

The first lamina 14a can have a thickness $T_1$ (FIG. 6) and side portions 26a that define a perimeter of the first lamina 14a. The side portions 26a further comprise one or more hem flanges 20 located along the perimeter of the first lamina 14a. In this application, the term "hem flange" refers to a flange in which the material has been bent about 180 degrees. As shown in FIGS. 5 and 6, the hem flanges 20 can include "open" hem flanges having top and bottom layers 22, 24 separated by a distance H. In this manner, the hem flanges 20 have an overall height dimension of $2T_1+H$.

The first lamina 14a can be formed such that the top layer 22 curves downward immediately adjacent each hem flange 20 such that the first lamina 14a is "dished" and the top layer 22 is substantially coplanar with the bottom layer 24, as shown in FIGS. 3, 5, and 6. In this manner, each first lamina 14a, in combination with the respective adjacent second lamina 14b in the microchannel array, can define a depth D of the high-pressure and low-pressure microchannels 12a, 12b. In the embodiment shown, the depth D can be approximately equal to $T_1+H$. The hem flanges 20 additionally comprise a width W defining a faying surface 28 (FIG. 3) on the top layer 22. In this manner, the faying surface 28 can be used for bonding the first lamina 14a to the adjacent second lamina 14b, as further described below. In alternative embodiments, the hem flanges 20 can comprise any other suitable type of flange.

In some embodiments, the inlet and outlet bosses 30a, 30b have heights approximately equal to the depth D (i.e., a height of approximately $T_1+H$) such that the inlet and outlet bosses 30a, 30b are in contact with the adjacent second lamina 14b. In this manner, the inlet and outlet bosses 30a, 30b can help to prevent deformation of the second lamina 14b during fabrication of the microchannel array by distributing bonding pressure across the first lamina 14a. The inlet and outlet bosses 30a, 30b can also help to prevent deflection of the first lamina 14a during operation due to pressure differentials between the high-pressure and low-pressure microchannels 12a and 12b. However, in alternative embodiments, the inlet and outlet bosses 30a, 30b need not contact the adjacent second lamina 14b. In further alternative embodiments, the first lamina 14a need not comprise the inlet bosses 30a and/or the outlet bosses 30b, such that the high-pressure inlet and/or outlet flow paths 16a, 16b can comprise substantially unrestricted flow regions, in a manner similar to the intermediate high-pressure flow paths 16c.

The first lamina 14a can be formed from materials capable of being cold-worked (i.e., capable of being worked or formed via low-temperature applications of pressure such as cold-rolling, stamping, embossing, electrically-assisted forming, etc.). In this manner, the hem flanges 20, the inlet bosses 30a, and the outlet bosses 30b can be formed into the first lamina 14a quickly and with less labor and materials than traditional PCM machining. This can reduce the cost of production of the microchannel array 10 over conventional microchannel arrays. In addition to being cold-workable, the materials from which the first lamina 14a is formed can also be resistant to corrosive fluids (e.g., as in chemical reactors or chemical distillation applications) and mechanical creep (e.g., as in high temperature applications such as heat exchangers and heat recuperators). Suitable materials from which the first lamina 14a may be fabricated include, without limitation, stainless steel, nickel superalloys, titanium alloys, and zirconium alloys. However, materials with lower creep temperatures and creep strengths, such as other steel allows and aluminum alloys, may also be used as further described below.

Figure 4:
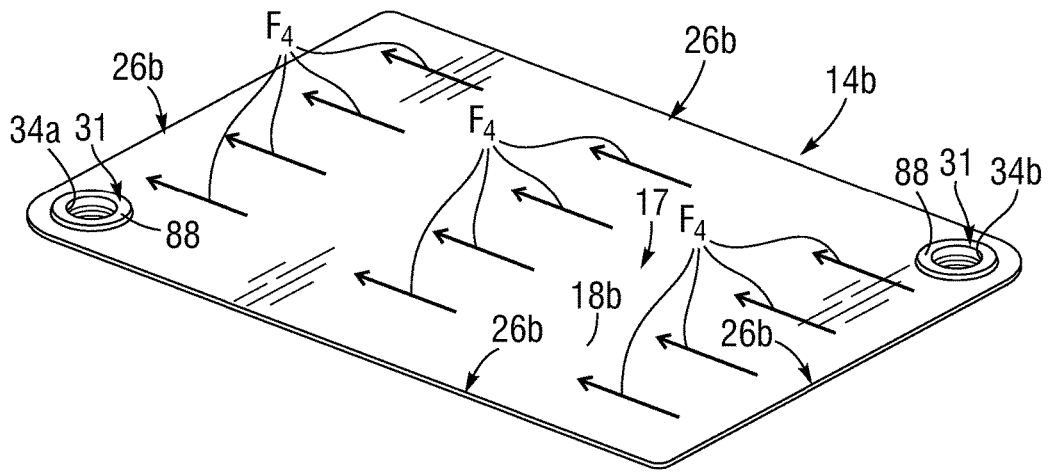
FIG. 4 is a perspective view of a second lamina.

Referring now to FIG. 4, there is shown a representative embodiment of a second lamina 14b. The second lamina 14b can have a thickness $T_2$ (FIG. 6) and side portions 26b that define a perimeter of the second lamina 14b. In some embodiments, $T_2$ is approximately equal to $T_1$, although $T_2$ may comprise any suitable thickness. The low-pressure flow paths 17 can be defined by the flow insert 38 (see, e.g., FIGS. 1, 7A and 7B) further described below. The low-pressure flow paths 17 can distribute a working fluid evenly across the surface 18b of the second lamina 14b in the manner indicated by flow lines $F_4$. The plurality of low-pressure flow paths 17 can number generally from about one to about one hundred, depending upon the size and application of the microchannel array. When a first lamina 14a is overlaid on top of the second lamina 14b, the low-pressure flow paths 17 can be enclosed to form low-pressure microchannels 12b. In some embodiments, the flow path depth D is the same for both the high-pressure and low-pressure microchannels 12a, 12b. Additionally, the second lamina 14b can be fabricated in substantially the same manner and from substantially the same materials as the first lamina 14a. In alternative embodiments, the low-pressure flow paths 17 can be defined by one or more bosses similar to the inlet and outlet bosses 30a, 30b of the first lamina 14a.

Figure 10:
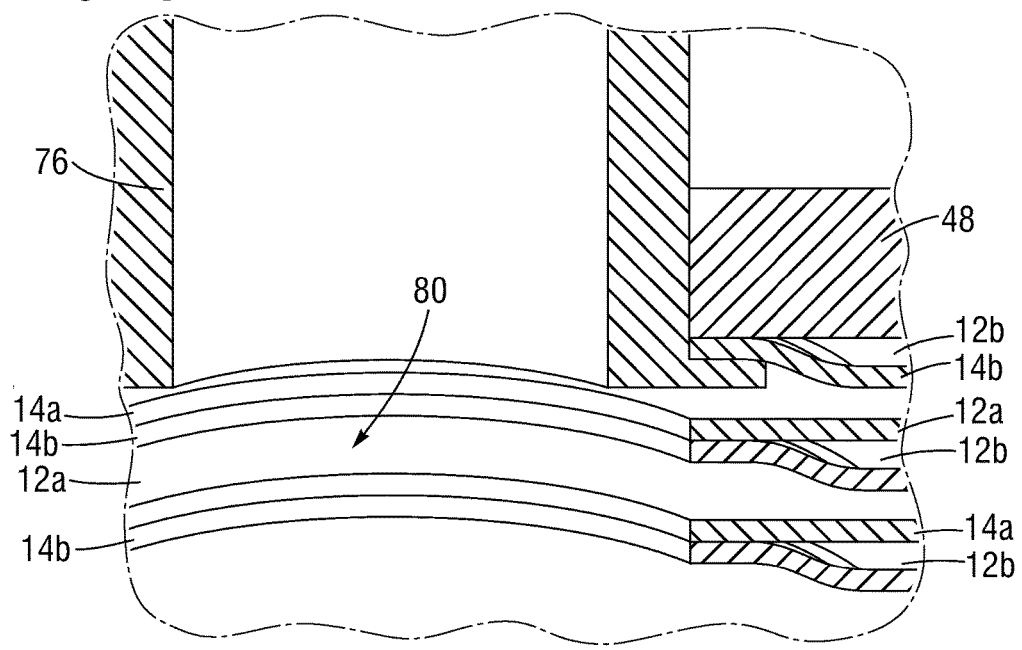
FIG. 10 is a partial cross-sectional view of a microchannel array in a housing taken through a high pressure inlet conduit of the housing.

The second lamina 14b also comprises inlet and outlet openings 34a, 34b. The inlet and outlet openings 34a, 34b of the second lamina 14b are defined by annular bosses 31, which can be formed into the second lamina 14b such that faying surfaces 88 of the annular bosses 31 are in contact with the adjacent first lamina 14a, as shown in FIG. 5. In this manner, the faying surfaces 88 can be used for bonding the first and second laminae 14a, 14b together. In some embodiments, the inlet opening 32a of the first lamina 14a is coaxial with inlet opening 34a of the adjacent second lamina 14b, and the outlet opening 32b of the first lamina 14a is coaxial with the outlet opening 34b of the second lamina 14b. Thus, when interleaved in a stacked arrangement, the coaxial inlet openings 32a, 34a of the first and second laminae 14a, 14b, respectively, can define a high-pressure inlet header 80 (see, e.g., FIGS. 1, 10). Similarly, the coaxial outlet openings 32b, 34b of the first and second laminae 14a, 14b can define a high-pressure outlet header 81 (see, e.g., FIG. 1). The high-pressure inlet header 80 and the high-pressure outlet header 81 can be in communication with all or substantially all of the high-pressure microchannels 12a. In this manner, the high-pressure inlet header 80 and the high-pressure outlet header 81 provide a steady supply of high-pressure fluid to, and steady evacuation of exhausted high-pressure fluid from, the high-pressure microchannels 12a, respectively.

In some embodiments, the first and second laminae 14a, 14b can be bonded together by laser beam welding (i.e., the bonding of two pieces of metal by concentrated heat imparted by a high-powered laser beam). The use of laser beam welding requires a smaller faying surface than diffusion bonding, allowing a reduction of the width W, and thus of the faying surface 28, of the hem flanges 20 over conventional microchannels. As shown in FIGS. 5-6, second laminae 14b can be bonded to first laminae 14a along the faying surfaces 28 of the hem flanges 20 of the first laminae 14a (see, e.g., FIG. 1), in the manner shown by weld lines 85. Similarly, first laminae 14a can be bonded to second laminae 14b along the faying surfaces 88 of the annular bosses 31 of the second laminae 14b (see, e.g., FIG. 4), in the manner shown by weld lines 87.

A microchannel array 10 can be made by placing a second lamina 14b on top of a first lamina 14a and bonding the two laminae together along the faying surface 28 of the hem flanges 20 of the first lamina 14a. Next, another first lamina 14a can be placed on top of the second lamina 14b, and the two laminae can be bonded together along the faying surface 88 of the annular boss 31. This process can be repeated until the desired number of high-pressure and low-pressure microchannels has been achieved. In this manner, fabrication of the microchannel array 10 can be performed by bonding one lamina at a time rather than attempting to bond all laminae at once, as with diffusion bonding. This approach can permit defects in the welds to be corrected as fabrication proceeds, thereby improving production yield and microchannel reliability. Additionally, because the welds performed on the first and second laminae 14a, 14b do not overlap one another, certain issues, such as weld crowning, can be reduced and/or eliminated. The laser beam welding pattern discussed herein can also seal the high-pressure microchannels 12a from the low-pressure microchannels 12b, while leaving the low-pressure microchannels 12b accessible for maintenance. Alternatively, the first and second laminae 14a, 14b can be bonded by adhesive bonding.

Figure 7A:
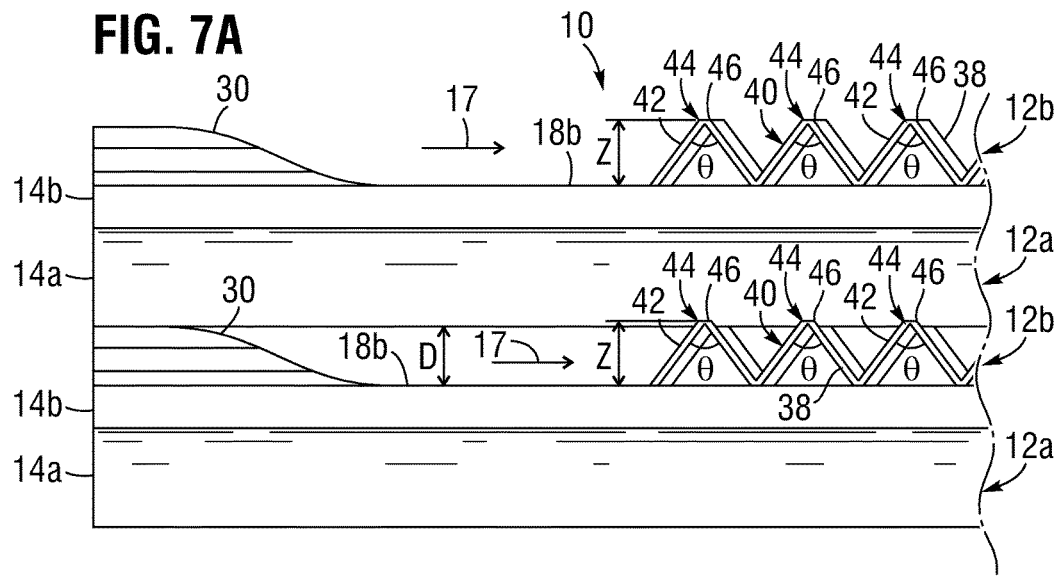
FIG. 7A is a cross-sectional view of a microchannel array having a flow insert.
Figure 7B:
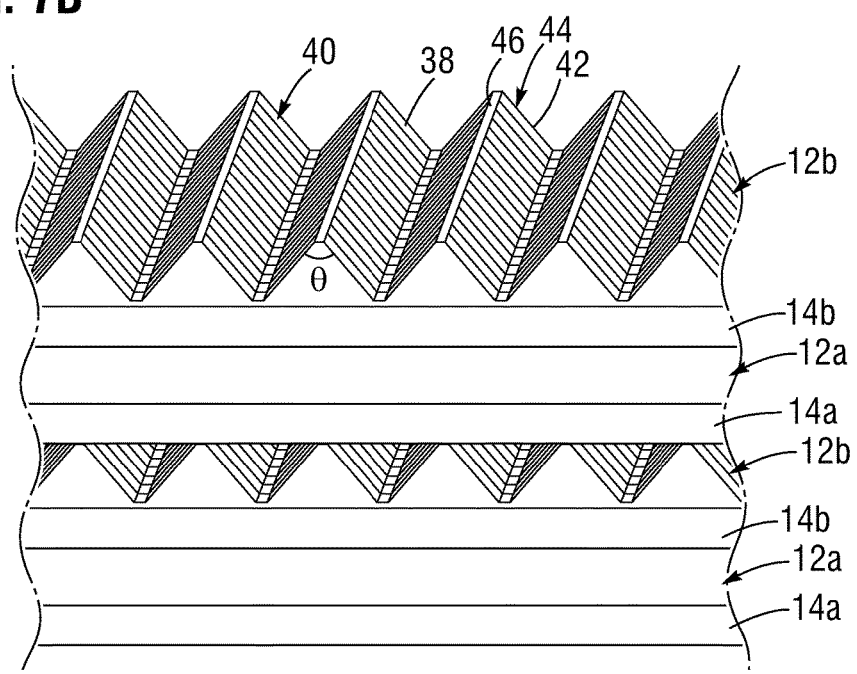
FIG. 7B is a perspective cross-sectional view of the microchannel array of FIG. 7A.

Referring now to FIGS. 7A and 7B, the low-pressure microchannels 12b can include a flow insert 38 disposed between the first and second laminae 14a, 14b on the surface 18b of the second laminae 14b (see also FIGS. 1, 2, and 2A). In some embodiments, the flow insert 38 can define the low-pressure flow paths 17 of the low-pressure microchannels 12b. The flow insert 38 is configured to resist deflection of the first lamina 14a of the adjacent high-pressure microchannels 12a so as to prevent the first lamina 14a from impinging on the low-pressure flow paths 17. Such deflection reduces the depth D of the low-pressure microchannels 12b, which can disrupt proper operation of the low-pressure microchannels 12b. Flow inserts such as the flow insert 38 can also eliminate the need for stamped features (e.g., ribs, islands, etc.) on the laminae, which can cause indentations on the opposite side of the laminae. By spreading the load over shorter spans, the flow insert 38 can also reduce the internal stresses in the first lamina 14a caused by the pressure differential between the high-pressure microchannels 12a and the low-pressure microchannels 12b. This can permit the first lamina 14a to be fabricated with less material and/or with less expensive materials.

In some embodiments, the flow insert 38 can comprise a micro-pyramidal truss network (MPTN) 40. However, it should be understood that other configurations suitable for maintaining the proper flow path depth D can be used. The MPTN 40 can include a plurality of truss members 42 arranged to form a series of diamonds or pyramids 44, as shown in FIGS. 7A and 7B. The pyramids 44 can be configured such that the MPTN 40 compresses or elastically deforms according to a spring constant of the MPTN 40. The truss members 42 can be configured such that each pyramid 44 has a height Z and an angle θ between truss members 42, as shown in FIG. 7A. Manipulation of the height Z and angle θ of the pyramids 44, in combination with the properties of the material from which the truss members 42 are fabricated, allow the spring constant of the MPTN 40 to be optimized according to the pressure differential between the high-pressure and low-pressure microchannels 12a, 12b.

In some embodiments, the height Z of the pyramids 44 can be greater than the flow path depth D of the low-pressure microchannels 12b. This leads to interference between the peaks 46 of the pyramids 44 and the adjacent first lamina 14a, as shown in FIG. 7A. Thus, the flow insert 38 can be inserted into the low-pressure microchannel 12b in a compressed state, with the peaks 46 of the pyramids 44 exerting a force proportional to the spring constant of the MPTN 40 against the first lamina 14a to resist deflection of the first lamina. Thus, in order for the first lamina 14a to deflect and impinge upon the low-pressure microchannels 12b, the force exerted by the pressurized fluid within the adjacent high-pressure microchannels 12a must overcome the force exerted by the flow insert 38 and further compress the MPTN 40 according to its spring constant.

In this manner, use of the flow insert 38 reduces the internal stresses realized by the first lamina 14a of the high-pressure microchannels 12a during operation by limiting deflection. This, in turn, allows the first lamina 14a to be fabricated with less material or with lower-cost materials than are required by conventional microchannel arrays, thereby reducing the cost of the microchannel array 10. Additionally, by defining the low-pressure flow paths 17, the flow insert 38 can simplify the design of the second lamina 14b by eliminating the need for bossed features.

In some embodiments, the depth D of the high-pressure and low-pressure microchannels 12a, 12b does not vary by more than 5% across the length of the high-pressure and low-pressure microchannels 12a, 12b, respectively, when the microchannel array 10 is in operation. The spring constant of the MPTN 40 can thus be configured to resist deflection of the first laminae 14a to no greater than 5% of the flow path depth D. In certain applications, the flow insert 38 can also comprise a catalyst or catalysts. The relatively large surface area of the flow insert 38 allows the catalyst or catalysts to interact efficiently with the fluid in the low-pressure flow paths 17 of the low-pressure microchannel 12b. Additionally, location of the flow insert 38 in the unsealed low-pressure microchannel 12b allows the flow insert 38 to be accessed or removed for servicing, such as for clearing blockages or redressing catalysts. Alternatively, the flow insert 38 can be bonded to one or both of the adjacent laminae to prevent movement of the flow insert 38 when the microchannel array 10 is in operation.

In alternative embodiments, the peaks 46 of the pyramids 44 need not contact the first lamina 14a of the adjacent high-pressure microchannels 12a. Rather, the flow insert 38 can be configured such that the peaks 46 are positioned below the first lamina 14a but do not contact the first lamina 14a. In this manner, the first lamina 14a can be allowed to deflect until the first lamina 14a contacts the peaks 46 of the pyramids 44, thereby arresting further deflection. Alternatively, the flow insert 38 need not comprise a micropyramidal truss network, but can comprise any suitable shape or configuration. Additionally, in some embodiments, both the low-pressure microchannels 12b and the high-pressure microchannels 12a may comprise flow inserts 38.

In some embodiments, the flow insert 38 can be fabricated from thin metal sheet stock. In some embodiments, the metal sheet stock can have a thickness of from about 0.001 inch to about 0.1 inch. In some embodiments, the metal sheet stock can have a thickness of from about 0.001 inch to about 0.015 inch. In some embodiments, the metal sheet stock can have a thickness of from about 0.002 inch to about 0.010 inch. In some embodiments, the metal sheet stock can be configured as an expanded metal foil. As used herein, the term "expanded metal foil" refers to a thin metal sheet that includes voids defined by interconnected metal members. In some embodiments, the flow insert 38 can be produced by corrugating metal sheet stock or expanded metal foil stock by, for example, stamping or rolling the metal sheet stock or expanded metal foil stock through patterned rolls. In this manner, the flow insert 38 can be fabricated using stamping architectures by enabling smaller minimum bend radii which, in turn, can allow smaller stamped features.

Figure 13:
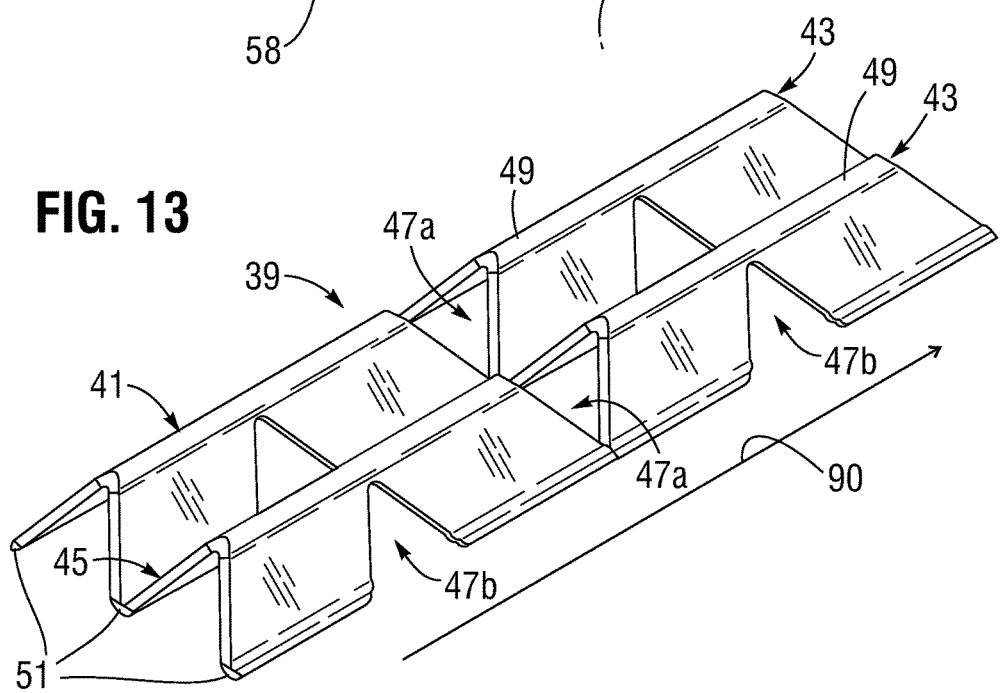
FIG. 13 is a perspective view of an alternative embodiment of a flow insert.

An alternative embodiment of the flow insert 39 is shown in FIG. 13. The flow insert 39 comprises a micro-pyramidal truss network 41 having periodic triangular ridges 43 and valleys 45. The triangular ridges 43 are punctuated by cutaway portions 47a, 47b. The cutaway portions 47a are oriented so as to form triangular notches extending downward from the peaks 49 of the triangular ridges 43, while the cutaway portions 47b form triangular notches extending upward from the bases 51 of the triangular ridges 43. In operation, the working fluid in the low-pressure microchannels 12b flows along the longitudinal axis of the flow insert 39, as indicated by flow arrow 90. In some embodiments, the periodicity of the micro-pyramidal truss network 41 is not symmetrical about the x-y plane. However, in alternative embodiments, the geometry of the flow insert 39 may be symmetrical about any suitable axis or axes. In some embodiments, the flow insert 39 can be stamped to define flow paths.

Referring now to FIGS. 8 and 9, the microchannel array 10 is enclosed in a housing 48 having a top portion 50 and a bottom portion 52. The top and bottom portions 50, 52 each comprise flanges 58 that are located along the perimeter of the top and bottom portions 50, 52, respectively. Each flange 58 comprises a plurality of holes 60 through which bolts or screws (not shown) may be inserted to join the top and bottom portions 50, 52 of the housing 48 together, as shown in FIG. 8. A seal 62 can be placed between the flanges 58 of the top and bottom portions 50, 52 to seal the interior of the housing 48 from the ambient, as shown in FIG. 9. In this manner, the sealed housing 48 eliminates the need to hermetically seal the low-pressure microchannels 12b from the ambient along the lamina margins, as is required in conventional microchannel arrays. Additionally, the housing 48 may be disassembled, thereby allowing access to the low-pressure microchannels 12b for regular maintenance. In this manner, the low-pressure microchannels 12b can be cleaned, blockages can be removed, and flow inserts 38 can be accessed, helping to prolong the service life of the microchannel array 10 over conventional microchannel arrays. However, in alternative embodiments, the top and bottom portions 50, 52 of the housing 48 can be configured to nest (i.e., the top portion 50 can extend partially within the bottom portion 52, or vice versa) such that the top and bottom portions can be joined together by, for example, brazing, welding, adhesive, etc. In this manner, the housing 48 need not include the flanges 58 and the seal 62, depending upon the particular application.

As shown in FIG. 8, the housing 48 can be configured such that when the microchannel array 10 is placed inside the housing 48, the interior walls 54 (see, e.g., FIGS. 11 and 12) of the top and bottom portions 50, 52 and the exterior of the microchannel array 10 define inlet and outlet plenums 56a, 56b, respectively. The inlet plenum 56a can be in communication with all or substantially all of the low-pressure microchannels 12b and can thereby function as an inlet header (i.e., a common inlet) for the low-pressure microchannels 12b. The outlet plenum 54b can also be in communication with all or substantially all of the low-pressure microchannels 12b and can thereby function as an outlet header (i.e., a common outlet or exhaust) for the low-pressure microchannels 12b.

Figure 12:
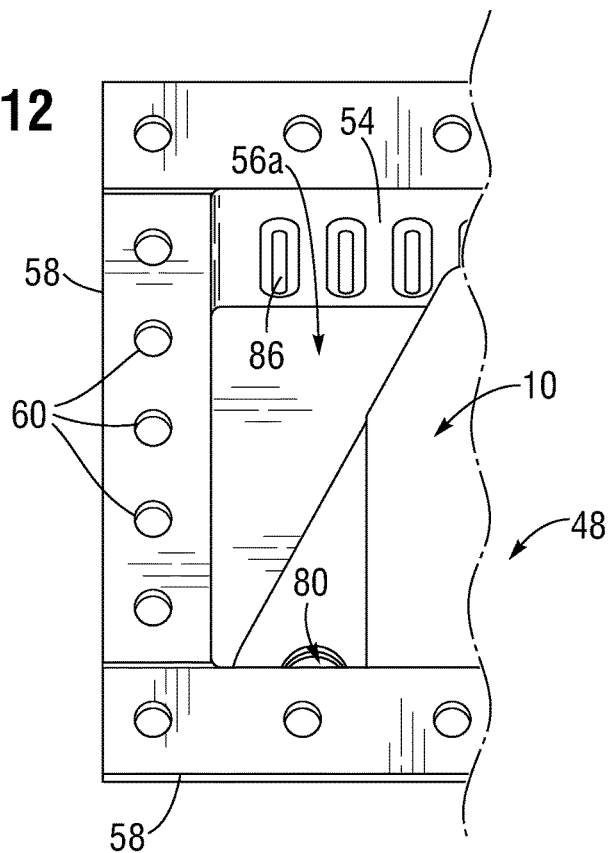
FIG. 12 is a partial perspective view of a microchannel array contained in a bottom portion of a housing.

In some embodiments, the inlet and outlet plenums 56a, 56b have a generally triangular shape, as best shown in FIGS. 8 and 12, in order to provide substantially uniform flow distribution from the inlet and outlet plenums 56a, 56b into the low-pressure microchannels 12b. The triangular shape of the inlet and outlet plenums 56a, 56b, together with their large interior volumes, helps to reduce the pressure drop across the low-pressure microchannels 12b when the microchannel array 10 is in operation. An additional advantage of this arrangement is that the inlet header 80 of the high-pressure microchannels 12a is allowed to thermally expand substantially independently of the inlet header (i.e., the inlet plenum 56a) of the low-pressure microchannels 12b. This can prevent buildup of thermal stresses and strains in the microchannel array 10, and can allow the array 10 to achieve a temperature drop of approximately 500 degrees Celsius across the length of the high-pressure microchannels 12a. In some embodiments, the low-pressure microchannels 12b can be configured to perform chemical reactions and the high-pressure microchannels 12a can be configured to perform, e.g., thermal management. In some embodiments, excess volume of the inlet and outlet plenums 56a, 56b above and below the microchannel array 10 can be reduced by, for example, indentations in the top and bottom portions 50, 52 of the housing 48. In this manner, the heights of the respective inlet and outlet plenums 56a, 56b can be substantially equal to the thickness of the microchannel array 10.

As shown in FIG. 9, the top portion 50 of the housing 48 comprises a first low-pressure inlet opening 64a, a first low-pressure outlet opening (not shown), and a high-pressure inlet opening 68. The first low-pressure inlet opening 64a is in communication with the inlet plenum 56a, and is configured to receive a first low-pressure inlet conduit 70a. The first low-pressure outlet opening is likewise in communication with the outlet plenum 56b, and is configured to receive a first low-pressure outlet conduit 72a. In a similar manner, the bottom portion 52 comprises a second low-pressure inlet opening (not shown), a second low-pressure outlet opening (not shown), and a high-pressure outlet opening (not shown).

The second low-pressure inlet opening is in communication with the inlet plenum 56a, and is configured to receive a second low-pressure inlet conduit 70b. The second low-pressure outlet opening is likewise in communication with the outlet plenum 56b, and is configured to receive a second low-pressure outlet conduit 72b. In this manner, the low-pressure inlet conduits 70a, 70b provide a steady supply of low-pressure fluid to the inlet plenum 56a through the top and bottom portions of the housing 48, respectively. In a similar manner, the low-pressure outlet conduits 72a, 72b provide steady evacuation of exhausted low-pressure fluid from the outlet plenum 56b through the top and bottom portions 50, 52 of the housing 48, respectively.

The high-pressure inlet opening 68 and the high-pressure outlet opening are configured to receive a high-pressure inlet conduit 76 and a high-pressure outlet conduit 78, respectively.

The high-pressure inlet conduit 76 provides a steady supply of high-pressure fluid to the high-pressure inlet header 80 (see, e.g., FIGS. 1 and 10) and thereby to the high-pressure microchannels 12a. Similarly, the high-pressure outlet conduit 78 provides for steady evacuation of exhausted high-pressure fluid from the high-pressure outlet header 81, helping to ensure smooth operation of the microchannel array 10. In some embodiments, the conduits 70a, 70b, 72a, 72b, 76, and 78 all comprise flanges 84 configured to allow the conduits to form a seal with the exterior of the housing 48 around the respective inlet or outlet openings, as shown in FIG. 9. However, in alternative embodiments, the conduits 70a, 70b, 72a, 72b, 76, and 78 can be configured to form a seal with the housing 48 against the interior surface of the housing 48 or inside the respective inlet or outlet openings. The flanges 84 can further includes seals or gaskets, as desired.

In some embodiments, the microchannel array 10 can include seals located between the high-pressure inlet and outlet headers 80, 81, and the housing 48 immediately adjacent the high-pressure inlet opening 68 and high-pressure outlet opening, respectively. In this manner, the seals can isolate the high-pressure fluid flowing through the high-pressure inlet and outlet headers 80, 81 from the ambient, and from the low-pressure fluid in the plenums 56a, 56b. Additionally, in some embodiments, the housing 48 need only have one of conduits 70a/70b, and/or one of conduits 72a/72b, depending on the desired flow characteristics.

Figure 11:
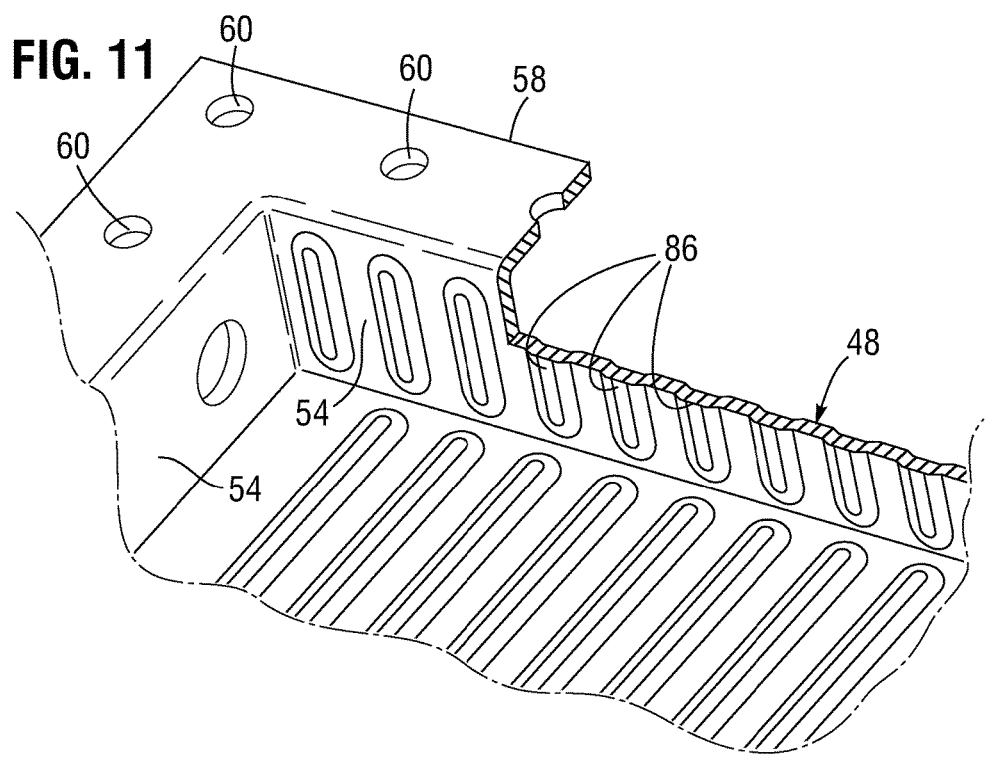
FIG. 11 is a partial perspective view of a bottom portion of a housing having corrugations.

As shown in FIG. 11, the top and bottom portions 50, 52 of the housing 48 additionally comprise bosses or corrugations 86 formed into the walls 54 of the top and bottom portions 50, 52. The corrugations 86 can increase the structural strength of the housing 48 while helping to ensure proper fit up between the microchannel array 10 and the interior walls 54 of the top and bottom portions 50, 52. In this manner, the corrugations 86 can allow for a reduction in the wall thickness of the top and bottom portions 50, 52 without compromising the strength of the housing 48 under operating pressures. Additionally, the corrugations 86 are oriented perpendicular to the direction of flow to prevent flow bypass between low-pressure microchannels 12b, helping to ensure that working fluid introduced into the inlet plenum 56a passes through the low-pressure microchannels 12b rather than around the low-pressure microchannels 12b between the array 10 and the housing 48. In alternative embodiments, other strengthening mechanisms such as plate inserts could be utilized to strengthen the housing 48.

In further alternative embodiments, flow bypass around the low-pressure microchannels 12b between the microchannel array 10 and the interior walls 54 of the housing 48 can be reduced by, for example, application of graphitic tape along the periphery of the microchannel array 10, which can eliminate the need for the corrugations 86.

Figure 14:
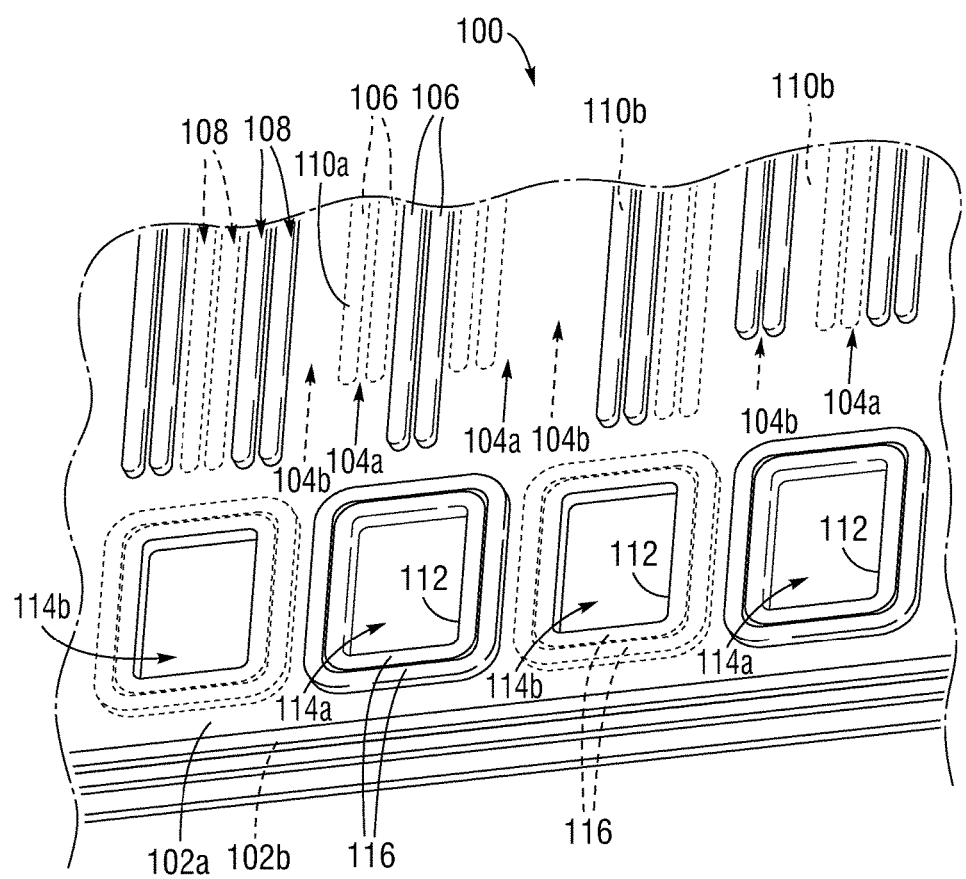
FIG. 14 is a perspective view of another embodiment of a microchannel array.

Referring now to FIG. 14, there is shown another embodiment of a microchannel array 100. The microchannel array 100 can comprise a plurality of first and second laminae 102a, 102b (for convenience, the features of a representative second lamina 102b are shown in phantom beneath a representative first lamina 102a). When the first and second laminae 102a, 102b are interleaved in a stacked arrangement (i.e., a first lamina 102a, then a second lamina 102b, then a first lamina 102a, etc.) they can define a plurality of first and second microchannels 110a, 110b. The first and second microchannels 110a, 110b can comprise a plurality of first and second flow paths 104a, 104b, respectively, defined by a plurality of elongated bosses 106. In the embodiment shown, each boundary of the flow paths 104a, 104b, are defined by a pair of elongated bosses 106 (i.e., the left boundary of each flow path is defined by two elongated bosses 106, and the right boundary of each flow path is defined by two elongated bosses 106), although the boundaries of the flow paths may comprise any suitable number of elongated bosses 106.

The elongated bosses 106 can be formed by stamping, rolling, or embossing of the first and second laminae 102a, 102b. The top surfaces 108 of the elongated bosses 106 can be used for bonding the first and second laminae 102a, 102b together. However, forming the elongated bosses 106 into the first and second laminae 102a, 102b by stamping, rolling, or embossing creates corresponding grooves in the surface opposite the elongated bosses 106. Thus, the first flow paths 104a of the first lamina 102a can be laterally offset from the second flow paths 104b of the second lamina 102b. In this manner, there is minimal overlap between the elongated bosses 106 of the first lamina 102a and the grooves in the adjacent surface of the second lamina 102b corresponding to the elongated bosses 106 of the second lamina 102b, as shown in FIG. 14. Laterally offsetting the first flow paths 104a from the second flow paths 104b in this manner allows each first lamina 102a to be bonded to the adjacent second lamina 102b, and vice versa. Bonding of the first and second laminae 102a, 102b may be accomplished by laser welding as discussed above with respect to the embodiment of FIG. 1, or by use of adhesive, or by any other suitable bonding method. Additionally, in the embodiment shown, the elongated bosses 106 can be configured to have a substantially rectangular cross-sectional shape, and can include rounded end portions. Alternatively, the elongated bosses 106 can comprise any suitable cross-sectional shape, including triangular, semi-circular, or semi-elliptical, to name a few, depending upon the desired flow characteristics in the microchannels 110a, 110b.

The first and second laminae 102a, 102b can also include a plurality of inlet openings 112 defined by one or more inlet bosses 116, and a plurality of outlet openings (not shown). The inlet openings 112 can be configured to function as inlet headers 114a, 114b (e.g., common inlets) of the first and second microchannels 110a, 110b, respectively. Similarly, the outlet openings are configured to function as outlet headers (e.g., common outlets) (not shown) of the first and second microchannels 110a, 110b. Each first microchannel 110a can comprise an inlet header 114a and an outlet header. Similarly, each second microchannel 110b can comprise an inlet header 114b and an outlet header. The inlet and outlet headers can be located on opposite ends of the microchannels 110a, 110b from one another. In the embodiment shown, the inlet headers 114a, 114b can each be defined by two concentric inlet bosses 116. Alternatively, the inlet headers 114a, 114b can be defined by any suitable number of inlet bosses. In some embodiments, the inlet openings 112 are square in shape. However, the inlet openings 112 and the outlet openings can comprise any suitable shape.

In some embodiments, the inlet and outlet headers can be in communication with respective internal or external manifolds configured to direct a flow of working fluid into the inlet openings 112 and to collect working fluid exhausted from the outlet openings (not shown). For example, some embodiments can include inlet and outlet plenums defined by, for example, cylindrical or semi-cylindrical features disposed on top of, and in communication with, the respective inlet and outlet headers. In some embodiments, the microchannel array 100 can be located in a housing similar to the housing of FIGS. 9-12. The housing can include a plurality of openings in communication with the inlet and outlet headers directly, or via plenums defined by, for example, cylindrical or semi-cylindrical features, as described above. In some embodiments, the first and second microchannels 110a, 110b can be configured as high-pressure and low-pressure microchannels, respectively, similar to the embodiment of FIG. 1.

Some of the advantages provided by the microchannel arrays described herein can include significant reduction in the cost and complexity of manufacturing microchannel arrays. For example, the microchannel arrays described herein can be fabricated without the use of material removal techniques such as photochemical machining. This can greatly reduce the cost of the microchannel arrays, which often must be fabricated from expensive metal alloys (e.g., stainless steel, nickel superalloys, titanium alloys, and zirconium alloys) so as to accommodate high temperature/high pressure fluid flow and/or corrosive fluids. The microchannels described herein can also improve manufacturing yield by reducing the need for diffusion bonding or diffusion brazing, which often render the interior geometry of the microchannels inaccessible. Reducing reliance on diffusion bonding or diffusion brazing can also reduce incidences of material creep, buckling of the laminae, and bonding defects.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A microchannel array, comprising:
   a first lamina having a primary surface configured to receive a fluid, a peripheral flange, and a plurality of elongated bosses defined on the primary surface, the peripheral flange extending along a perimeter of the first lamina, the plurality of elongated bosses at least partially defining a plurality of first flow paths on the primary surface, the first lamina defining at least one opening in the primary surface; and
   a second lamina having a plurality of second flow paths, the second lamina defining at least one opening;
   wherein the second lamina is disposed above the first lamina such that the second lamina encloses the first flow paths of the first lamina and the at least one opening of the first lamina is coaxial with the at least one opening of the second lamina; and
   wherein the peripheral flange comprises an edge portion of the first lamina folded over along the perimeter of the first lamina to form a top layer and a bottom layer; and
   wherein the top layer of the peripheral flange extends downwardly such that a top surface of the peripheral flange is offset from the primary surface of the first lamina.

2. The microchannel array of claim 1, wherein the microchannel array further comprises a plurality of first and second laminae interleaved with one another in a stacked arrangement.

3. The microchannel array of claim 2, wherein the first flow paths enclosed by the second laminae define first microchannels and the second flow paths enclosed by the first laminae define second microchannels.

4. The microchannel array of claim 3, wherein the first microchannels are configured to operate at a first pressure and the second microchannels are configured to operate at a second pressure.

5. The microchannel array of claim 3, further comprising a plurality of flow inserts disposed between adjacent first and second laminae, the flow inserts defining the plurality of second flow paths of the second laminae.

6. The microchannel array of claim 1, wherein the plurality of first flow paths comprise at least one unrestricted flow region.

7. The microchannel array of claim 1, wherein a distance by which the primary surface of the first lamina is offset from the top surface of the peripheral flange defines a depth of the first flow paths.

8. The microchannel array of claim 7, wherein:
   the top and bottom layers of the peripheral flange are separated by a gap;
   the first lamina comprises a thickness; and
   the depth of the first flow paths is defined by a sum of the gap between the top and bottom layers of the peripheral flange and the thickness of the first lamina.

9. The microchannel array of claim 1, wherein the second lamina is bonded to the first lamina along the top surface of the peripheral flange.

10. The microchannel array of claim 1, wherein the peripheral flange is configured such that the primary surface of the first lamina is coplanar with the bottom layer of the peripheral flange.

11. A microchannel array, comprising:
    a plurality of first laminae, each of the first laminae comprising a side portion, the side portion defining a perimeter, the side portion comprising one or more flanges extending along the perimeter of the first laminae, each of the first laminae comprising a plurality of first flow paths and defining at least one opening; and
    a plurality of second laminae, each of the second laminae comprising a plurality of second flow paths and a header portion, the header portion comprising an annular boss, the annular boss defining an opening;
    wherein the plurality of second laminae are interleaved with the plurality of first laminae such that second laminae are disposed above respective first laminae, and such that the openings of the first laminae are coaxial with the openings of the second laminae; and
    wherein the microchannel array further comprises a plurality of removable flow inserts situated on the second laminae and configured to elastically deflect to limit deflection of the first laminae into the flow paths of the second laminae during microchannel operation.

12. The microchannel array of claim 11, wherein the first and second laminae are bonded together along the perimeter of the first lamina.

13. The microchannel array of claim 11, wherein the one or more flanges comprise hem flanges.

14. The microchannel array of claim 11, wherein the first flow paths are hermetically sealed from the second flow paths and from the ambient.

15. The microchannel array of claim 11, wherein the microchannel array is contained in a housing including an inlet plenum and an outlet plenum.

16. The microchannel array of claim 11, wherein the first flow paths and the second flow paths are configured in a counterflow arrangement.

17. The microchannel array of claim 11, wherein the removable flow inserts comprise corrugated metal sheets.

18. The microchannel array of claim 11, wherein the flow inserts comprise micro-pyramidal truss networks including a plurality of truss members arranged to form a series of pyramids.

19. The microchannel array of claim 11, wherein the removable flow inserts comprise a plurality of angled truss members arranged to form a series of triangular peaks and valleys.

20. The microchannel array of claim 19, wherein the truss members of the removable flow inserts extend between the second laminae and the adjacent first laminae and contact the adjacent first laminae.

21. The microchannel array of claim 11, wherein the removable flow inserts are inserted between the second laminae and the adjacent first laminae in a compressed state.

22. A method of making a microchannel array, comprising:
    bonding a first lamina and a second lamina, the first lamina having a primary surface configured to receive a fluid, a peripheral flange, and a plurality of elongated bosses defined on the primary surface, the peripheral flange extending along a perimeter of the first lamina, the plurality of elongated bosses at least partially defining a plurality of first flow paths on the primary surface, the first lamina defining at least one opening in the primary surface, the peripheral flange comprising an edge portion of the first lamina folded over along the perimeter of the first lamina to form a top layer and a bottom layer, the top layer of the peripheral flange extending downwardly such that a top surface of the peripheral flange is offset from the primary surface of the first lamina;

wherein the second lamina comprises a plurality of second flow paths and a header portion, the header portion comprising an annular boss, the annular boss defining an opening; and wherein the bonding further comprises bonding the second lamina to the top layer of the peripheral flange of the first lamina such that the first flow paths of the first lamina are enclosed by the second lamina.

23. The method of claim 22, wherein the method further comprises bonding a plurality of second laminae to a plurality of first laminae along peripheral flanges of respective first laminae in an interleaved, stacked arrangement.

24. The method of claim 22, further comprising inserting a removable flow insert between the second lamina and another adjacent first lamina, the removable flow insert defining the plurality of second flow paths of the second lamina.

* * * * *